(12) United States Patent  
Takatani et al.

(10) Patent No.: US 7,656,916 B2
(45) Date of Patent: Feb. 2, 2010

(54) SEMICONDUCTOR LIGHT EMITTING DEVICE AND METHOD FOR FABRICATING SAME

(75) Inventors: Kunihiro Takatani, Nara (JP); Daisuke Hanaoka, Mihara (JP); Masaya Ishida, Mihara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 12/000,929

(22) Filed: Dec. 19, 2007

(65) Prior Publication Data

US 2008/0151952 A1    Jun. 26, 2008

(30) Foreign Application Priority Data

Dec. 22, 2006   (JP)   ............... 2006-346520

(51) Int. Cl.
    *H01S 3/04*     (2006.01)
(52) U.S. Cl. ................. 372/36; 372/34; 372/60
(58) Field of Classification Search ............ 372/36, 372/34
    See application file for complete search history.

(56) References Cited

U.S. PATENT DOCUMENTS

| 5,392,305 | A | 2/1995 | Jakobson |
| 6,242,761 | B1 | 6/2001 | Fujimoto et al. |
| 7,238,076 | B2 | 7/2007 | Yoshida et al. |
| 2003/0214987 | A1* | 11/2003 | Yamanaka et al. ............ 372/43 |
| 2007/0170441 | A1* | 7/2007 | Takizawa et al. ............. 257/79 |

FOREIGN PATENT DOCUMENTS

| JP | 10-313147 | 11/1998 |
| JP | 2003-298171 | 10/2003 |
| JP | 2004-252425 | 9/2004 |
| JP | 2004-273908 | 9/2004 |

* cited by examiner

*Primary Examiner*—Dung T Nguyen
(74) *Attorney, Agent, or Firm*—Harness, Dickey & Pierce, P.L.C.

(57) ABSTRACT

A nitride semiconductor device includes a stem. A heat sink is provided on the stem. At least one nitride semiconductor light-emitting element is connected to the heat sink. A light-detecting element for detecting light from the semiconductor light-emitting element is provided on the stem. A cap for encapsulating therein the heat sink, the semiconductor light-emitting element, and the light-detecting element in a sealed manner is connected to the stem. The space in the cap has an encapsulated atmosphere. The encapsulated atmosphere contains a component for inhibiting diffusion of hydrogen atoms contained in the semiconductor light-emitting element. The present invention suppresses defect due to an increase in operation voltage to increase a ratio of good goods thereby improving the fabrication yield of the semiconductor light-emitting device.

14 Claims, 11 Drawing Sheets

Assembly apparatus

SEMICONDUCTOR LIGHT EMITTING DEVICE AND METHOD FOR FABRICATING SAME

FIELD OF THE INVENTION

The present invention generally relates to semiconductor light-emitting devices, and more particularly to a semiconductor light-emitting device improved to be capable of suppressing defect due to an increase in operation voltage. The present invention also relates to a method for fabricating such a semiconductor light-emitting device.

DESCRIPTION OF THE RELATED ART

Group III nitride semiconductor laser elements have wide oscillation wavelength from the ultraviolet light to visible light and are paid to attention as short-wavelength light sources applicable to high-density optical recording media. In addition to optical recording media, group III nitride semiconductor laser elements are expected as visible light sources such as lights and backlights. For a wider range of application, technology is being developed for operational stability of the nitride semiconductor laser element while improving its light-emitting output.

Figure 11:
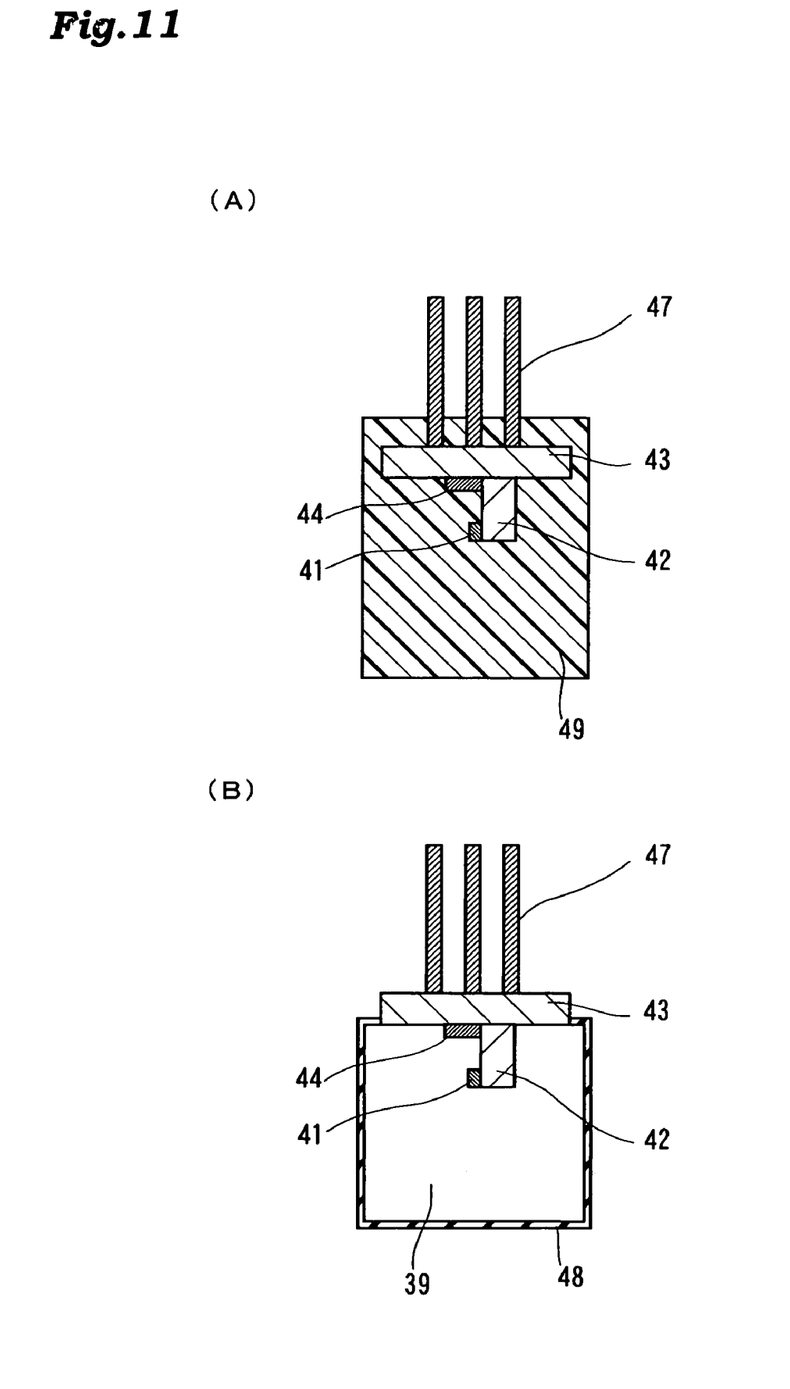
FIG. 11(A) is a cross sectional view of a semiconductor laser light source which is molded with a light-transmitting plastic substance.
FIG. 11(B) is a cross sectional view of a conventional semiconductor laser light source encapsulated by a cap.

FIG. 11(A) is a cross sectional view of a conventional semiconductor laser light source (see, for example, Japanese Patent Application Publication No. 10-313147). The semiconductor laser light source has a semiconductor laser chip 41 for emitting laser light. The semiconductor laser chip 41 is mounted to a heat sink 42. The heat sink 42 is connected to the bottom of a stem 43. A light-detecting element 44 is mounted to the bottom of the stem to monitor the intensity of laser light emitted from the semiconductor laser chip 41. To the other side of the stem 43 are mounted electrode lead lines 47 each for GND, for driving the semiconductor laser, and for the light-detecting element. An electrode for GND is connected and conducted to the stem 43, and electrodes for driving the semiconductor laser and for light-detecting element are respectively connected and conducted to the semiconductor laser chip 41 and the light-detecting element 44 through wire bondings, not shown.

In the semiconductor laser light source shown in FIG. 11(A), the entire surface of the stem 43 is molded by a light-transmitting plastic substance 49 such as a synthetic resin, except for the semiconductor laser chip 41, the heat sink 42, the light-detecting element 44, and the electrode lead lines 47. According to this form of packaging, there is no portion which is weak in strength. Therefore, the semiconductor laser device can be placed in a vacuum environment or a high-pressure environment.

Referring to FIG. 11(B), the prior art recites another embodiment, which provides a cap 48, instead of molding the light-transmitting plastic substance. The internal atmosphere 39 in the cap 48 is replaced with an inactive gas. This enables the semiconductor laser device to be placed in a vacuum environment or a high-pressure environment.

However, when the prior art method in which the inactive gas atmosphere is sealed is applied to a nitride semiconductor laser which is driven by injecting high density current such as 10 kA/cm$^2$ to the electrodes and semiconductor layers, the voltage cannot be maintained at its initial state, thus causing problems including an un-stable life characteristic and increased operation voltage.

These problems are believed to be due to the following causes. In the nitride semiconductor, Mg is doped as a p-type impurity. Meanwhile, the crystal contains hydrogen atoms so that the hydrogen atoms and the Mg form a composite. This hinders activation of the Mg in the film, which causes a reduction in acceptor concentration and in hole density. As a result, the crystal is provided with high resistivity.

SUMMARY OF THE INVENTION

The present invention has been made in view of the foregoing problems, and an object of the present invention is to provide a semiconductor light-emitting device improved such that the operation voltage does not increase after a long period of driving.

Another object of the present invention is to improve a semiconductor light-emitting device having a current-confined-path structure realized by a ridge-stripe structure such that the operation voltage does not increase after a long period of driving.

Another object of the present invention is to provide a method for fabricating a semiconductor light-emitting device improved to be capable of suppressing defect due to an increase in operation voltage to increase a ratio of good goods thereby improving the fabrication yield of the semiconductor light-emitting device.

A semiconductor light-emitting device according to the present invention includes a stem. A heat sink is provided on the stem. At least one semiconductor light-emitting element is connected to the heat sink. A light-detecting element for detecting light from the semiconductor light-emitting element is provided on the stem. A cap for encapsulating therein the heat sink, the semiconductor light-emitting element, and the light-detecting element in a sealed manner is connected to the stem. An atmosphere in the cap contains a component for inhibiting diffusion of hydrogen atoms contained in the semiconductor light-emitting element.

Since the atmosphere in the cap, i.e., the atmosphere surrounding the semiconductor light-emitting element, contains a component for inhibiting diffusion of hydrogen atoms contained in the semiconductor light-emitting element, diffusion of hydrogen atoms in the element is inhibited, which causes the P-type impurity Mg not to be compensated, resulting in no reduction in hole density.

The present invention exhibits its advantageous effects when the semiconductor light-emitting element contains hydrogen atoms at a concentration of $1 \times 10^{17}/cm^3$ or more.

Examples of the semiconductor light-emitting element include a semiconductor laser element, a light-emitting diode (LED), and a super-luminescent diode.

According to a preferred embodiment of the present invention, the semiconductor light-emitting element includes: on a front surface thereof, a ridge-stripe structure for forming a current-confined-path structure having one electrode electrically connected only to a top of a protruding portion of the ridge-stripe structure; and an insulation layer sandwiching the protruding portion of the ridge-stripe structure, the insulation layer containing hydrogen atoms at a concentration of $1 \times 10^{17}/cm^3$ or more. The present invention exhibits its advantageous effects particularly in the case of the semiconductor light-emitting element having the above configuration.

The semiconductor light-emitting element includes: on a front surface thereof, a ridge-stripe structure for forming a current-confined-path structure having one electrode electrically connected only to a top of a protruding portion of the ridge-stripe structure; and a semiconductor layer sandwiching the protruding portion of the ridge-stripe structure, the semiconductor layer having substantially the same composition as a composition of the protruding portion of the ridge-stripe structure while having an opposite polarity to a polarity of the protruding portion and containing hydrogen atoms at a concentration of $1×10^{17}/cm^3$ or more.

The component for inhibiting diffusion of hydrogen atoms preferably includes oxygen.

The insulation layer is preferably made of a dielectric containing at least one of $SiO_2$, $TiO_2$, $ZrO_2$, $HfO_2$, $CeO_2$, $In_2O_3$, $Nd_2O_5$, $Sb_2O_3$, $SnO_2$, $Ta_2O_5$, and $ZnO$. Use of $SiO_2$ or $TiO_2$ is particularly preferable in terms of processing issues, refractive index, insulation, and adhesivity against other layers.

The atmosphere preferably contains oxygen at a concentration of at least 10 ppm.

The concentration of moisture contained in the atmosphere is preferably less than 1000 ppm, more preferably less or equal to 500 ppm.

The atmosphere preferably has a pressure of from 0.1 Pa to 200 kPa.

The present invention is effective particularly in the case of the semiconductor light-emitting element being group III nitride semiconductor light-emitting element such as BN, AlN, InN, GaN, and TlN, which oscillate mainly at a wavelength of from 350 to 550 nm. A wavelength of from 350 to 550 nm has high energy, and light of the wavelength activates hydrogen atoms to render it easy to diffuse, resulting in a tendency toward light degradation. The present invention is effective particularly in such a case.

The present invention is effective in the case of the semiconductor light-emitting element being group III-V compound semiconductor light-emitting element, which oscillates mainly at a wavelength of 550 nm or more.

The present invention exhibits its advantageous effects particularly in the case of the semiconductor light-emitting element containing hydrogen atoms in a semiconductor layer structure.

The atmosphere may contain carbon dioxide or argon.

A method according to another aspect of the present invention-relates to a method for fabricating a semiconductor light-emitting device wherein the atmosphere in the cap contains a component for inhibiting diffusion of hydrogen atoms contained in the semiconductor light-emitting element. First, a fabricating apparatus is prepared. The fabricating apparatus comprises a working chamber and a front chamber. The working chamber has a mechanism and an externally-isolated sealed space for assembling the semiconductor light-emitting device. The front chamber is linked to the working chamber for temporarily holding a member necessary for assembly of the semiconductor light-emitting device. The necessary member is introduced to the front chamber. The necessary member is then moved from the front chamber to the working chamber without opening the working chamber to atmosphere. An atmosphere in the working chamber is substituted with a diffusion-inhibiting atmosphere containing a component for inhibiting diffusion of hydrogen atoms contained in the semiconductor light-emitting element. The semiconductor light-emitting device is assembled in the working chamber under the diffusion-inhibiting atmosphere.

According to this aspect of the present invention, the diffusion-inhibiting atmosphere can be filled in the cap by merely assembling the semiconductor light-emitting device in the working chamber.

According to the present invention, since the atmosphere in the cap, i.e., the atmosphere surrounding the semiconductor light-emitting element contains a component for inhibiting diffusion of hydrogen atoms contained in the semiconductor light-emitting element, diffusion of hydrogen atoms in the element is inhibited, which causes the P-type impurity Mg not to be compensated by hydrogen atoms, resulting in no reduction in acceptor concentration, and eventually in hole density. As a result, the crystal is not provided with high resistivity so that the operation voltage does not increase after a long period of driving with injection of current at a high density. Thus, abnormality due to an increase in element operation voltage during current electrification is inhibited.

DETAILED DESCRIPTION OF THE EMBODIMENTS

In the drawings, reference numeral 10 denotes a nitride semiconductor laser element, 20 denotes a heat sink, 30 denotes a light-detecting element, 39 denotes a internal atmosphere, 40 denotes a stem, 41 denotes a semiconductor laser chip, 42 denotes a heat sink, 43 denotes a stem, 44 denotes a light-detecting element, 47 denotes an electrode lead line, 48 denotes a cap, 49 denotes a light-transmitting, plastic substance, 50 denotes a cap, 60 denotes a window, 70 denotes an electrode lead line, 80 denotes an encapsulated atmosphere, 101 denotes a front chamber, 102 denotes a working chamber, 103 denotes a purging gas introducing mechanism, 104 denotes an assembly mechanism, 105 denotes a vacuum mechanism, 106 denotes a gas introducing mechanism, 107 denotes a gas exhausting mechanism, 108 denotes a measuring mechanism, 109 denotes a door, 200 denotes a substrate, 201 denotes an n-type GaN layer, 202 denotes a lower cladding layer, 203 denotes an n-type GaN guiding layer, 204 denotes a lower adjacent layer, 205 denotes an active layer, 206 denotes an upper adjacent layer, 207 denotes a p-type $Al_{0.2}Ga_{0.8}N$ layer, 208 denotes a p-type upper cladding layer, 209 denotes a p-type contact layer, 220 denotes a negative electrode, 221 denotes a positive electrode, 222 denotes an insulation film, 231 denotes a first layer, 232 denotes a second layer, and 233 denotes a third layer.

The object of obtaining a semiconductor light-emitting device improved such that the operation voltage does not increase after a long period of driving was realized by containing in the atmosphere in the cap a component for inhibiting diffusion of hydrogen atoms contained in the semiconductor light-emitting element.

Figure 1:
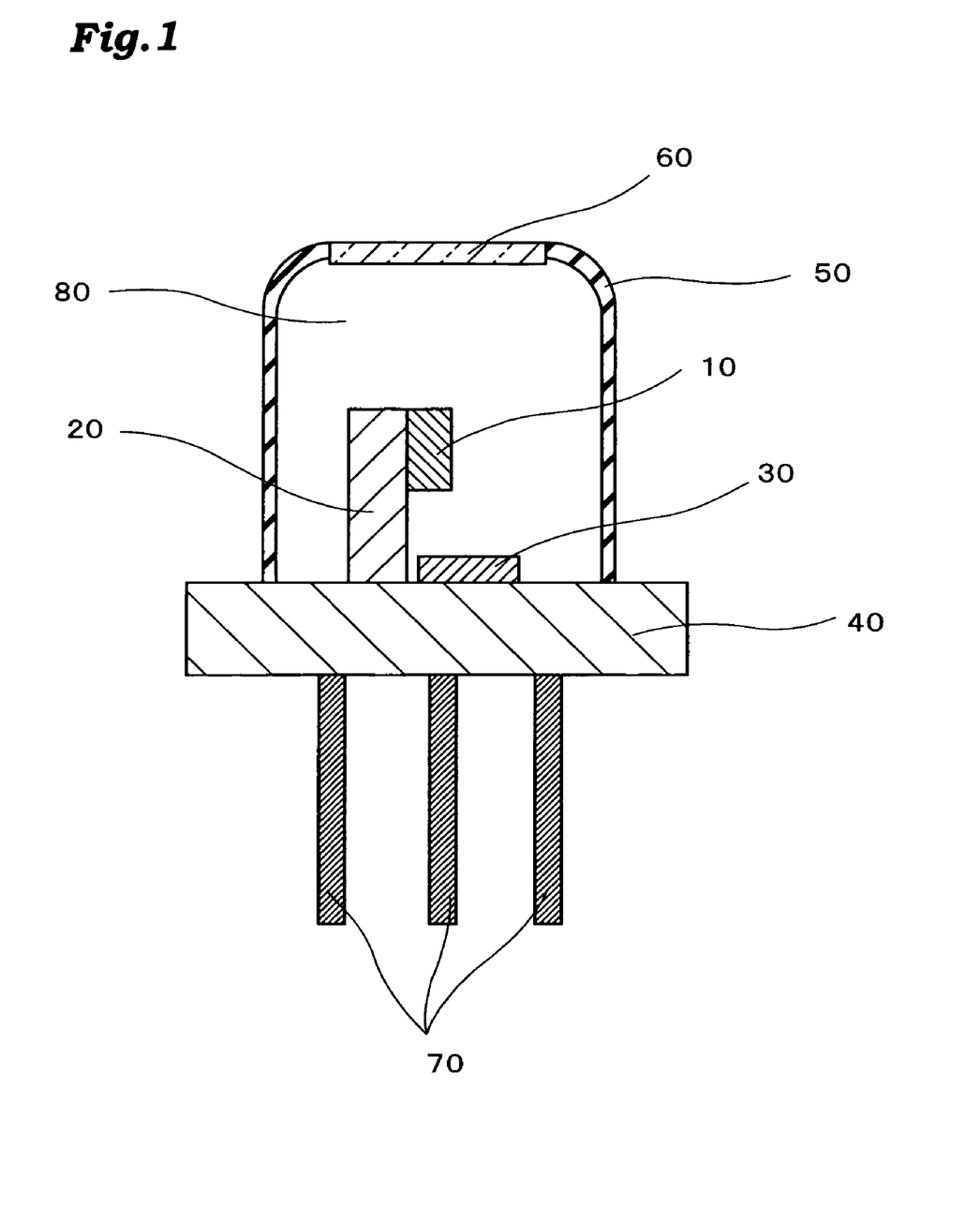
FIG. 1 is a schematic diagram showing a nitride semiconductor laser device according to the present invention.

FIG. 1 is a schematic diagram showing a nitride semiconductor laser device according to the present invention. The nitride semiconductor laser device according to the present invention has a stem 40. A heat sink 20 is mounted on the stem 40. At least one nitride semiconductor laser element 10 for emitting laser light is connected to the heat sink 20. A light-detecting element 30 for observing the intensity of light from the nitride semiconductor laser element 10 is provided on the stem 40. A cap 50 for encapsulating therein in a sealed manner the stem 40, the heat sink 20, the nitride semiconductor laser element 10, and the light-detecting element 30 is connected to the stem 40.

Electrode lead lines 70 are connected to the stem 40, and the cap 50 has a window 60 through which to extract light emitted from the nitride semiconductor laser element 10. The space in the cap 50 contains an encapsulated atmosphere 80. The encapsulated atmosphere 80 contains a component, e.g., oxygen, for inhibiting diffusion of hydrogen atoms contained in the nitride semiconductor laser element 10. Gas components other than oxygen include inactive gas such as nitrogen, rare gas such as argon, and carbon dioxide.

The concentration of oxygen is preferably at least 10 ppm, more preferably 1000 ppm or more.

The pressure of the encapsulated atmosphere is in the range of from 0.1 Pa to 200 kPa. The concentration of moisture contained in the encapsulated atmosphere is restricted below 1000 ppm, more preferably restricted to 500 ppm or less, where the advantageous effects of the present invention are easily exhibited.

Group III nitride semiconductor laser used in the present invention is made of a nitride semiconductor crystal represented by the formula $B_vAl_wGa_xIn_yTl_zN$ ($0 \leq v \leq 1$, $0 \leq w \leq 1$, $0 \leq x \leq 1$, $0 \leq y \leq 1$, $0 < z \leq 1$, $v+w+x+y+z=1$). B denotes boron, Al denotes aluminum, Ga denotes gallium, In denotes indium, Tl denotes thallium, and N denotes nitrogen. Also, v denotes the content ratio of boron, w denotes the content ratio of aluminum, x denotes the content ratio of gallium, y denotes the content ratio of indium, and z denotes the content ratio of thallium. In the present specification, a nitride semiconductor layer made of a nitride semiconductor crystal represented by, for example, $Al_wGa_xN$ ($0<w<1$, $0<x<1$, $w+x=1$) will be hereinafter simply referred to as a AlGaN layer.

When the nitride semiconductor crystal constituting the nitride semiconductor layer is hexagonal, less than 10% of the nitrogen elements in the nitride semiconductor layer may be substituted with at least one kind of element selected from the group consisting of arsenic, phosphorus, and antimony. Also the nitride semiconductor layer is doped with at least one kind of element consisting of silicon, oxygen, chlorine, sulfur, selenium, carbon, germanium, zinc, cadmium, magnesium, and beryllium so that the nitride semiconductor layer has p-type, n-type, or i-type conductivity.

The nitride semiconductor crystal is produced by metalorganic chemical vapor deposition (MOCVD). Since in MOCVD the carrier gas and the V source gas contain hydrogen atoms, the hydrogen atoms are taken into the nitride semiconductor crystal. Molecular beam epitaxy (MBE) may be used as a method for growing the nitride semiconductor crystal, in which case the use of ammonia as a V source involves hydrogen atoms taken into the nitride semiconductor crystal.

The oscillation wavelength of group III semiconductor laser element 10 is mainly in the range of from 350 to 550 nm. While description has been made by referring to group III semiconductor laser element as the light-emitting element, the advantageous effects of the present invention are likewise obtained if group III semiconductor laser element is substituted with a nitride semiconductor super-luminescent diode or a nitride semiconductor light-emitting diode.

The present invention will be described in further detail below.

Example 1

FIG. 2(A) is a schematic cross sectional view of a semiconductor laser element used in a semiconductor laser device according to example 1 of the present invention.

An insulation layer 222 is provided on the periphery of a protruding portion of a ridge-stripe structure to form a current-confined-path structure that has one electrode electrically connected only to the top of the protruding portion, thereby limiting part in which current passes. The current-confined-path structure enables an approximate control of the spot shape of emitted light. The insulation layer 222 contains hydrogen atoms at a concentration of $1 \times 10^{17}/cm^3$ or more. The width of the protruding portion of the ridge-stripe structure is approximately 1.6 µm, and the length of the resonator is 600 µm. The element is subjected to AR (anti-reflective) coating on the front surface and HR (high reflection) coating on the rear surface.

P-type conductive layers are doped with, as a dopant, magnesium (Mg) at a concentration of from $1 \times 10^{19}$ to $1 \times 10^{20}/cm^3$. The concentration is representatively $4 \times 10^{19}/cm^3$ in an upper cladding layer 208 and a contact layer 209. In this example, the p-type GaN contact layer 209 may be omitted, where the upper cladding layer 208 also serves the contact layer.

An active layer 205 is of a multople quantum well structure composed of undoped $In_{0.15}Ga_{0.85}N$ well layers (thickness: 4 nm each) and undoped GaN barrier layers (thickness: 8 nm each) arranged in the order: well layer/barrier layer/well layer/barrier layer/well layer (three wells). The well layer and the barrier layer may be formed of nitride semiconductor such as $In_xGa_{1-x}N$ ($0 \leq x<1$), $Al_xGa_{1-x}N$ ($0 \leq x<1$), $In_xGa_{1-x-y}Al_yN$ ($0 \leq x<1$, $0 \leq y<1$), $GaN_{1-x}As_x$ ($0<x<1$), $GaN_{1-x}P_x$ ($0<x<1$), and a compound of the foregoing. As for the composition of the barrier layer, the barrier layer has higher band gap energy than the well layer. While the active layer preferably is of a multople quantum well (MQW) structure with two to four wells for the purpose of lowering the oscillation threshold value, a single quantum well (SQW) structure will not be excluded. In this case, what the present specification refers to the barrier layer sandwiched between the well layers does not exist.

A positive electrode 221 is composed of, in the order from the side of the p-type GaN upper cladding layer 209, a first layer 231 (Pd layer/Mo layer), a second layer (barrier layer), and a third layer 233 (pad). The layer from the barrier layer on is also formed on the insulation layer 222. The barrier layer therefore preferably has good adhesivity with respect to the insulation layer and has a function to improve adhesivity. The Pd layer is a layer for having ohmic contact with the p-type nitride semiconductor.

Upon electrification between the positive electrode 221 and the negative electrode 220, light is emitted in the manner shown in FIG. 2(B).

The semiconductor laser element with the above configuration can be fabricated by a conventional crystal growth method of nitride semiconductor. Each of the semiconductor layers is accumulated by MOCVD or MBE, followed by formation of the ridge-stripe structure by etching processing with the use of dry etching. The layers constituting the positive and negative electrodes can be accumulated by usual vacuum deposition such as high-frequency sputtering, as well as electron beam (EB) vacuum deposition.

Group III nitride semiconductor laser element according to example 1 fabricated in the above manner was mounted in a semiconductor laser device (laser package) and subjected to an electrification test. The gas atmosphere encapsulated by the cap was a mixture gas of 15% oxygen and 85% nitrogen. The concentration of moisture contained in the mixture gas was restricted to 100 ppm (dew point: approximately −40° C.). Under test conditions of high temperature of 70° C., the device was driven with constant current of DC 120 mA and the element operation voltage was monitored.

Figure 3:
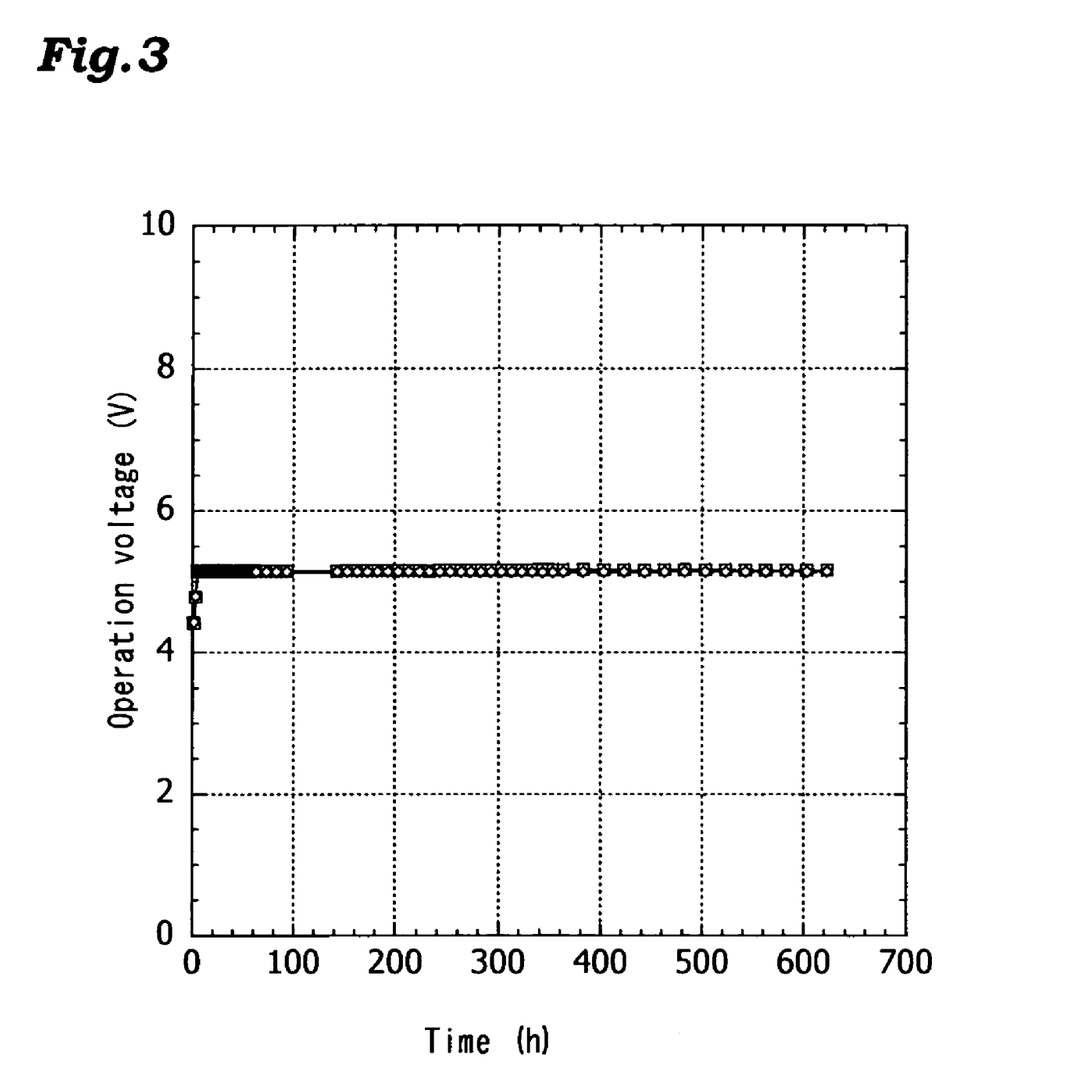
FIG. 3 is a graph showing the results of an electrification test carried out using the nitride semiconductor laser element shown in FIG. 2.

The results show that the element according to example 1 maintains a stable operation at a constant element voltage (approximately 5.2 V) after elapse of 600 hours. The results are shown in the graph in FIG. 3. Thus, the devices according to example 1 showed a stable voltage characteristic under a high current density driving condition of approximately 13 kA/cm$^2$.

Comparative Example

As a comparison example with respect to example 1, a laser package was prepared from group III nitride semiconductor laser element used in example 1, with inactive gas such as the one recited in patent document 1 encapsulated by the cap. The laser package was subjected to a similar electrification test. The inactive gas contained approximately 100% nitrogen gas, and the concentration of moisture contained therein was restricted to 100 ppm.

Figure 4:
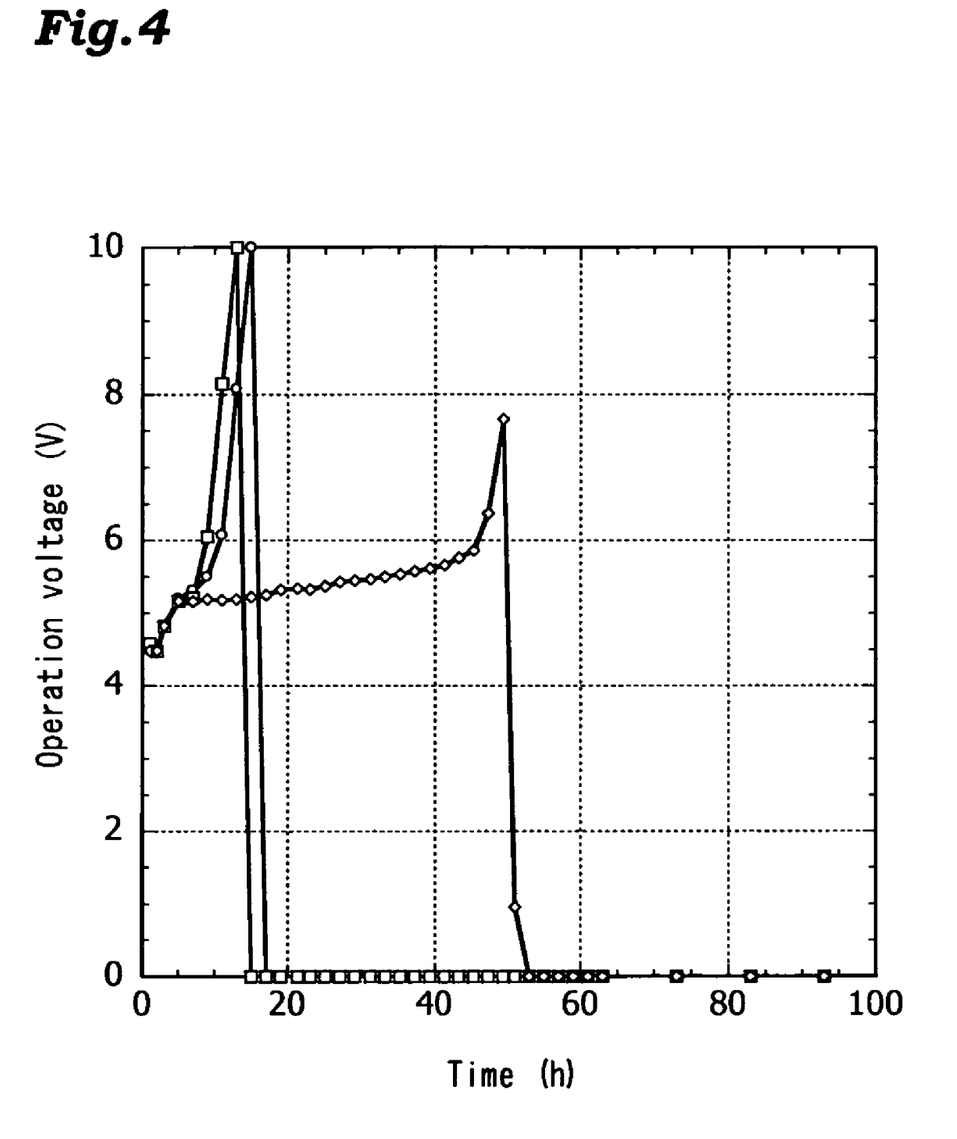
FIG. 4 is a graph showing the results of an electrification test carried out using a comparison element.

As a result of DC 120 mA constant current driving at 70° C., many elements had a rapid increase in operation voltage as shown in FIG. 4.

(Analysis)

Figure 5:
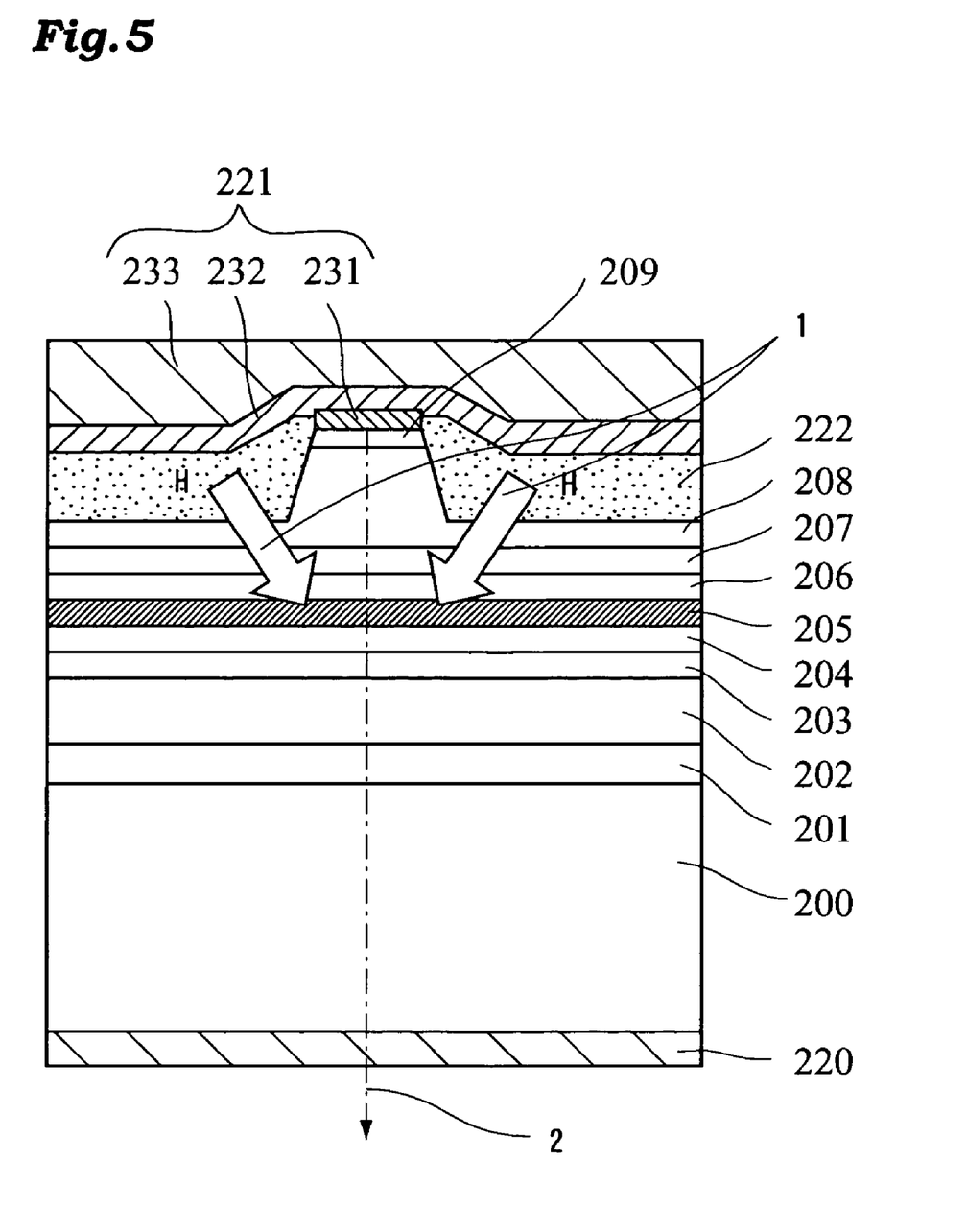
FIG. 5 is a diagram illustrating why the element operation voltage increases in a comparison example.

Example 1 has a number of possible models that prevent the increase in element operation voltage observed in the comparative example. One of the models is a laser package encapsulated by the cap with inactive gas such as the one recited in patent document 1. As shown in FIG. 5, hydrogen atoms contained in the insulation layer 222 diffuse to the nitride semiconductors (207, 206, 205), as indicated by arrows 1, where the hydrogen atoms and Mg, which is a p-type impurity, form a composite. The formation of the composite compensates Mg to cause a reduction in acceptor concentration, and eventually in hole density. As a result, the crystal is provided with high resistivity.

A possible model of example 1 is such that the oxygen component of the cap encapsulated atmosphere inhibits diffusion of hydrogen atoms to the in of group III semiconductor laser element, resulting in no compensation of Mg.

Figure 2:
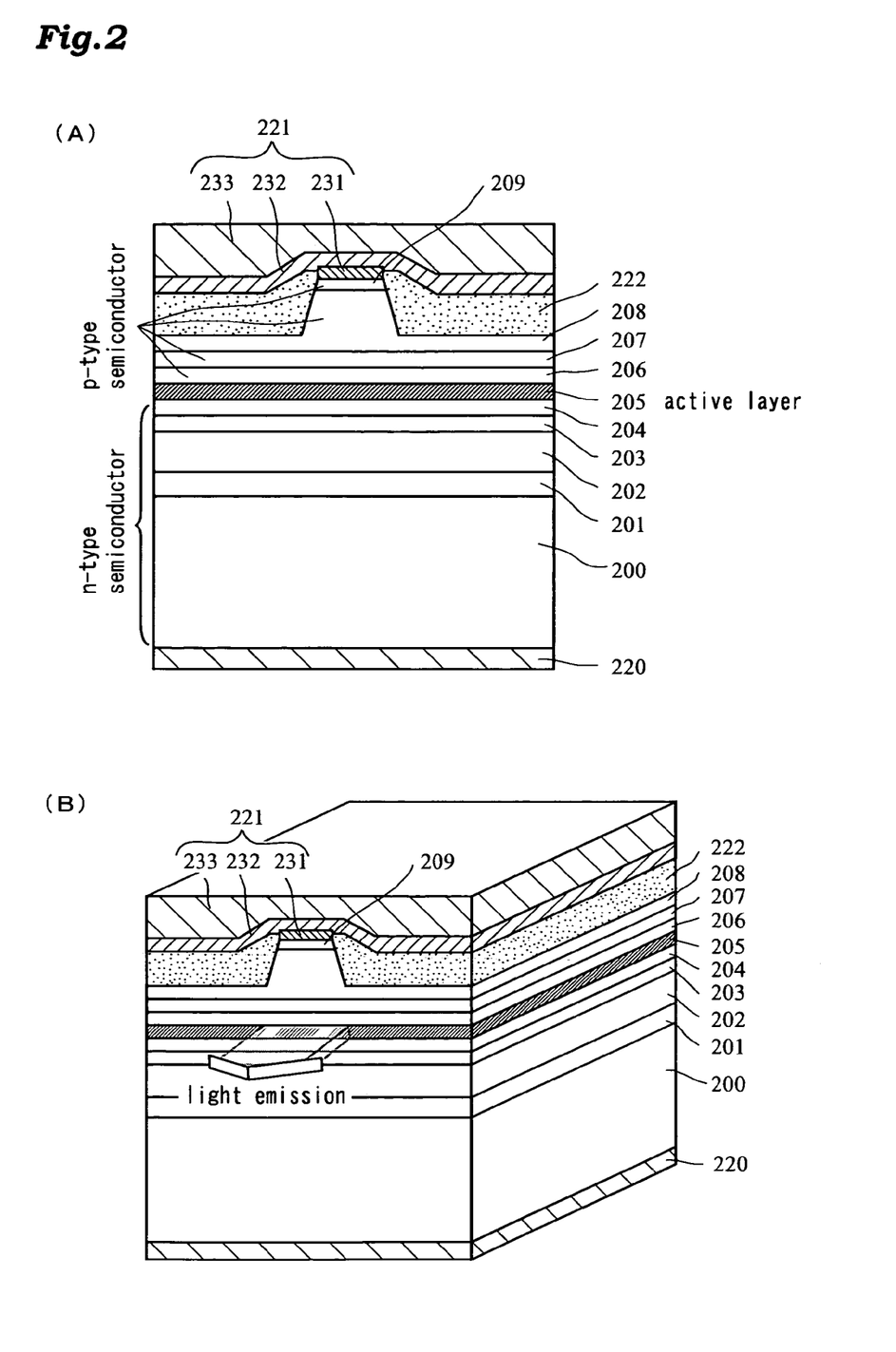
FIG. 2(A) is a schematic cross sectional view of a nitride semiconductor laser element used in example 1 of the present invention.
FIG. 2(B) is a perspective view of the nitride semiconductor laser element used in example 1 for illustrating a manner in which light is output.

Devices shown in FIG. 1 were assembled each with the semiconductor laser element shown in FIG. 2 and a varied atmosphere in the cap. The devices were then driven and had respective laser elements removed thereafter. The electrodes 221 and 222 were removed from each element to compare the hydrogen atoms concentrations in the elements by SIMS (Secondary Ionization Mass Spectrometer) analysis. Referring to FIG. 5, the SIMS analysis was carried out downward from the surface of the p-type GaN contact layer 209 along a dotted lined-arrow 2. Three samples were used in the analysis.

Figure 6:
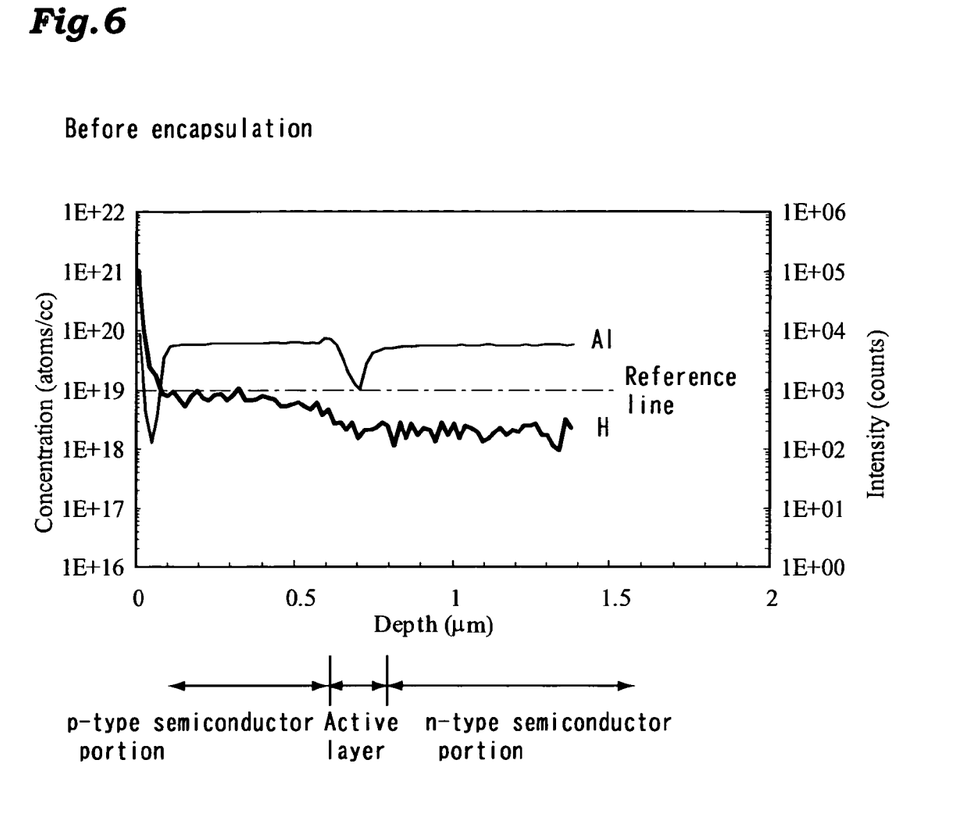
FIG. 6 is a graph showing the results of a SIMS analysis of a semiconductor laser element before cap encapsulation.
Figure 7:
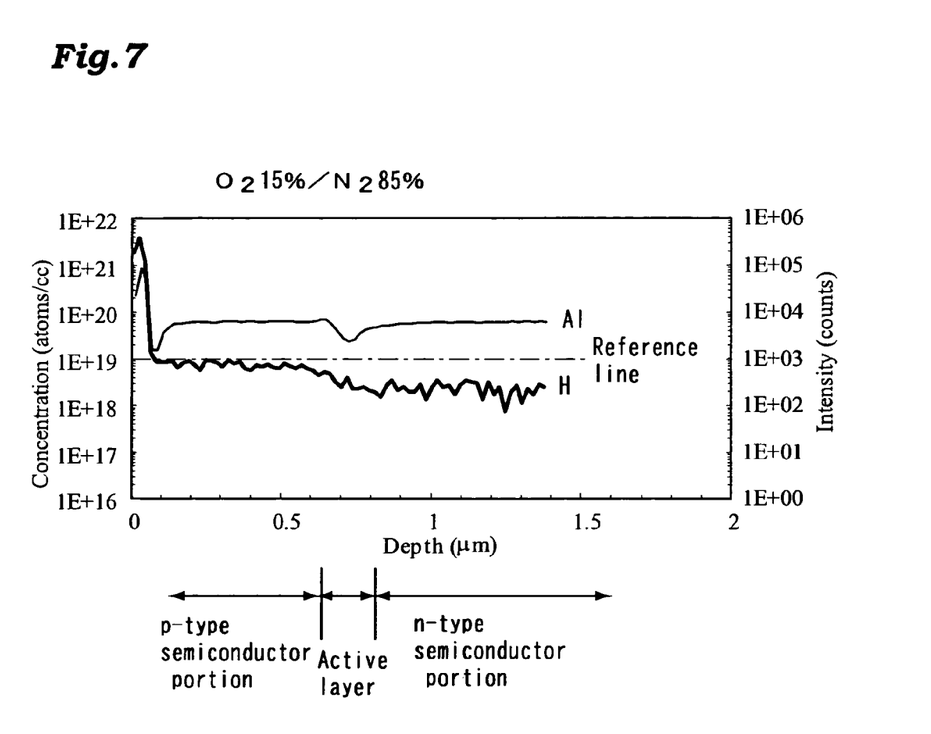
FIG. 7 is a graph showing the results of a SIMS analysis of the semiconductor laser element after cap encapsulation with a mixture gas of 15% oxygen and 85% nitrogen.
Figure 8:
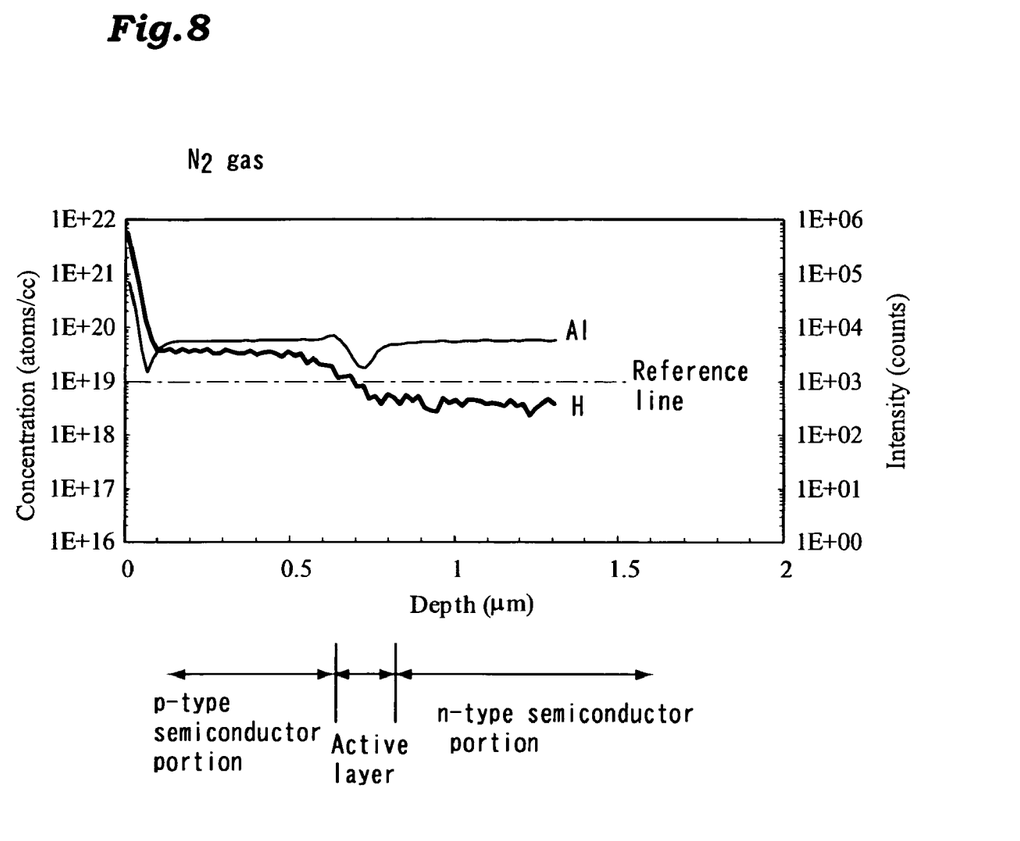
FIG. 8 is a graph showing the results of a SIMS analysis of the semiconductor laser element after cap encapsulation with a nitrogen gas.

FIG. 6 shows the results of analysis of a laser element before packaging, for use as a reference. FIG. 7 shows the results of analysis of a laser element driven for 100 hours at a constant current of DC 120 mA at 70° C. after cap encapsulation with a mixture gas of 15% oxygen and 85% nitrogen with a moisture concentration of 100 ppm, as in example 1. FIG. 8 shows, as a comparative example, the results of analysis of a laser element driven for 100 hours at a constant current of DC 120 mA at 70° C. after cap encapsulation with substantially 100% nitrogen with a moisture concentration of 100 ppm.

In each of FIGS. 6, 7, and 8, the portion of rapid reduction in beam intensity of Al indicates the active layer. On both side of the active layer, a p-type semiconductor portion (shallow portion) and an n-type semiconductor portion (deep portion) appear. In each of the figures, a reference line (1E+19) represented by a dotted line is provided to make illustration more understandable.

Referring to FIG. 7, in example 1, i.e., in the case of the element encapsulated with a mixture gas of 15% oxygen and 85% nitrogen, the concentration of hydrogen atoms contained in the p-type semiconductor portion in the element remained unchanged, i.e., about the same as that in the laser element before packaging (FIG. 6). (The hydrogen atoms concentration was equal to or less than the reference line ((1E+19)) at the p-type semiconductor portion.) Meanwhile, referring to FIG. 8, in the element encapsulated with nitrogen gas, the concentration of hydrogen atoms contained in the p-type semiconductor portion in the element got approximately four times higher than that in the laser element before packaging. (The hydrogen atoms concentration is far beyond the reference line (1E+19) at the p-type semiconductor portion.)

The large increase in the hydrogen atoms concentration at the p-type semiconductor portion, as observed in the element encapsulated with nitrogen gas, compensates the p-type impurity Mg, which causes a reduction in hole density at the p-type semiconductor portion and an increase in film resistance, resulting in an increase in element operation voltage. This phenomenon is believed to have occurred.

As described above, the increase in hydrogen atoms concentration in the element is believed to be caused by diffusion of hydrogen atoms atoms from outside the semiconductor layers. A possible main source of the hydrogen atoms is the insulation layer (insulation layer 222 shown in FIG. 2), which constitutes the element structure. In view of this, a SiO$_2$ film, which is frequently used for the insulation layer, was subjected to SIMS analysis to measure its hydrogen atoms concentration. The analysis revealed that in some cases the film contained hydrogen atoms at a higher order of 10$^{21}$/cm$^3$. Although the measured film was formed using an electron-beam vacuum deposition apparatus, which is frequently used for the fabrication process of semiconductor laser elements, it is possible enough depending on film formation conditions that a film formed by other methods such as by using a sputtering apparatus contains hydrogen atoms at a higher order of 10$^{19}$ to 10$^{21}$/cm$^3$.

Thus, when current is applied to a laser element provided with an insulation layer containing hydrogen atoms at high concentration, the hydrogen atoms contained in the insulation layer attempt to diffuse toward the semiconductor layers. However, when the encapsulated atmosphere contains oxygen as in example 1, the hydrogen atoms in the insulation layer is fixed and inhibited from diffusing toward the semiconductor layers. This is believed to eliminate the tendency toward compensation of the p-type impurity Mg.

On the basis of this model, a detailed analysis was carried out as to the concentration of oxygen contained in the encapsulated atmosphere and the effect of inhibiting the increase in element operation voltage. The results revealed that the advantageous effect of the present invention appeared when the oxygen concentration was 10 ppm or more. At 1000 ppm or more, the advantageous effect of the present invention became remarkable.

It is unknown why the oxygen component contained in the encapsulated atmosphere inhibits diffusion of hydrogen atoms in the semiconductor layers and fixes it. Still, referring again to FIGS. 1 and 5, by containing oxygen in the encapsulated atmosphere 80, that is, by containing oxygen in the atmosphere gas surrounding the nitride semiconductor laser element 10, the hydrogen atoms in the semiconductor layers moves and is drawn to the oxygen. The direction of movement of the hydrogen atoms and the diffusion direction of the hydrogen atoms represented by the arrow 1 are opposite to one another to balance out. As a result, diffusion of hydrogen atoms is believed to stop apparently.

Figure 9:
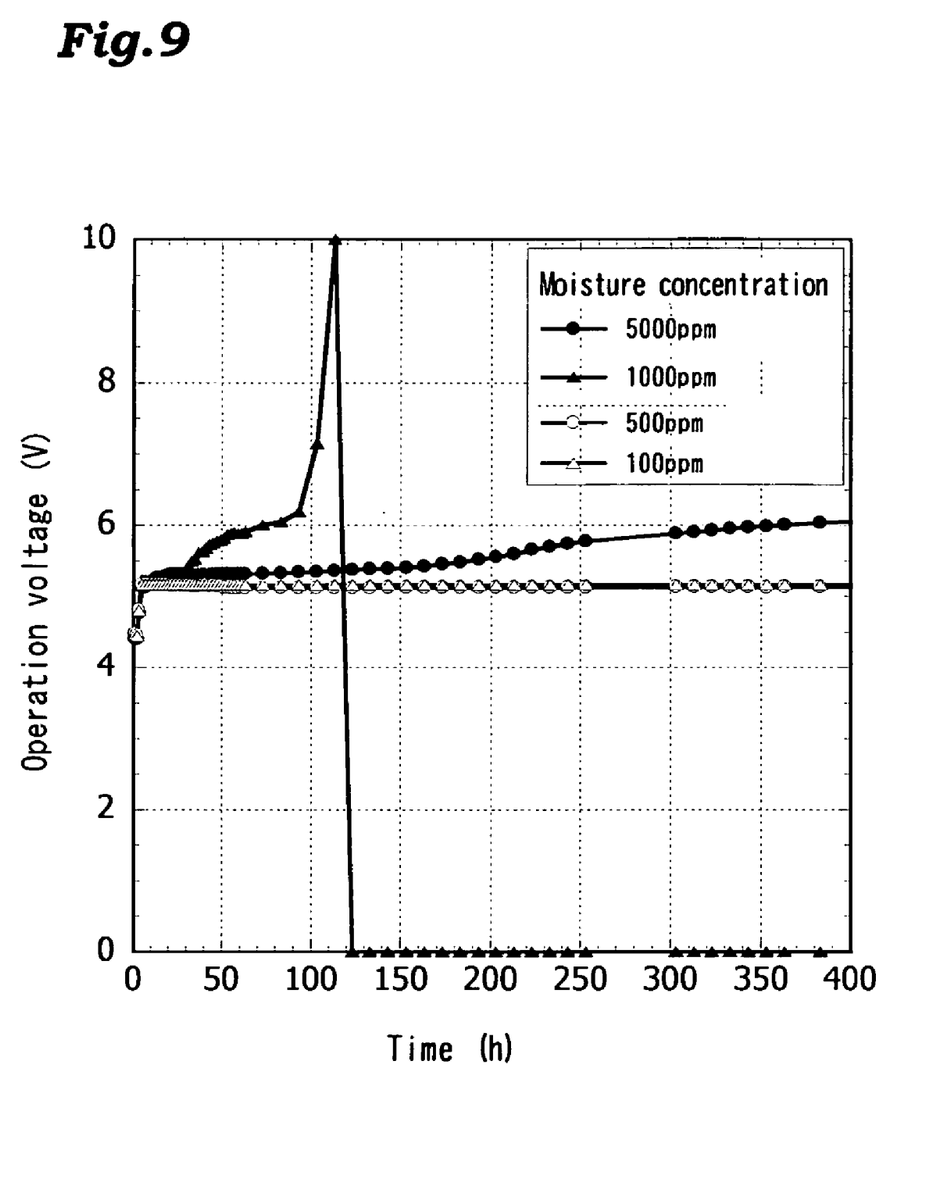
FIG. 9 is a graph showing the results of an electrification test carried out using the nitride semiconductor laser element shown in FIG. 2 with a change in moisture concentration.

When the concentration of moisture contained in the encapsulated atmosphere was 1000 ppm or more, an increase in element operation voltage was observed in some samples even though the encapsulated atmosphere contained oxygen, as shown in FIG. 9. Thus, in order to realize the advantageous effect of the present invention, the concentration of moisture is less than 1000 ppm, and more preferably, the concentration is restricted to 500 ppm or less.

Thus, since the advantageous effect of the present invention largely depends on the concentrations of oxygen and moisture contained in the encapsulated atmosphere, the pressure of the encapsulated atmosphere is not particularly specified. Still, in view of workability of an assembly apparatus of the semiconductor laser device described later, the pressure is preferably from 0.1 Pa to 200 kPa.

The kind of gas contained in the mixture gas together with oxygen is not limited to inactive gas such as nitrogen and rare gas such as argon; the advantageous effect of the present invention can be obtained when carbon dioxide is selected. Alternatively, a mixture gas of the foregoing may be used.

Regarding the relationship between the concentration of hydrogen atoms in the insulation layer and the increase in element operation voltage, it has been found that when the concentration of hydrogen atoms in the insulation layer is more than $10^{17}/cm^3$ an increase in element operation voltage frequently occurs, and that this phenomenon can be sufficiently inhibited by containing oxygen in the encapsulated atmosphere as in example 1.

While the schematic diagram in FIG. 1 shows an example where the nitride semiconductor laser element 10 and the heat sink 20 directly connected to one another, the nitrides semiconductor laser element 10 and the heat sink 20 may be connected to one another through a sub-mount provided therebetween.

While in example 1 group III nitride semiconductor laser element is used as the light-emitting element, the advantageous effect of the present invention can be obtained if an element made of group III-V compound semiconductor such as aluminum, indium, gallium, arsenic, phosphorus is used instead, since the increase in operation voltage is believed to be caused by hydrogen atoms contained in the element, as described above by referring to a model. Also in the case of III-V compound semiconductor, the phenomena of incorporation of hydrogen atoms into the crystal at the time of doping of the p-type impurity Mg and of diffusion of hydrogen atoms contained in the insulation layer constituting the element structure toward the semiconductor occur. Thus, there are cases where hydrogen atoms are contained in the element structure. By introducing oxygen into the encapsulated atmosphere, the hydrogen atoms are inhibited from compensating the p-type impurity Mg.

While a $SiO_2$ film has been exemplified as the insulation layer, it has been confirmed that the advantageous effect of the present invention can be obtained if $TiO_2$, $ZrO_2$, $HfO_2$, $CeO_2$, $In_2O_3$, $Nd_2O_5$, $Sb_2O_3$, $SnO_2$, $Ta_2O_2$, ZnO, a mixture of the foregoing is used.

While in example 1 a semiconductor light-emitting device has been exemplified having a current-confined-path structure with the insulation layer 222 formed as if to sandwich the protruding portion of the ridge-stripe structure, the present invention is not limited to this structure. The advantageous effect of the present invention can be obtained with a semiconductor light-emitting device having a current-confined-path structure with, instead of the insulation layer, a semiconductor layer having substantially the same composition as the composition of the protruding portion of the ridge-stripe structure while having an opposite polarity to the polarity of the protruding portion and containing hydrogen atoms at a concentration of $1\times10^{17}/cm^3$ or more.

Example 2

A method for fabricating the nitride semiconductor laser device according to the present invention, and an assembly apparatus will be described.

Figure 10:
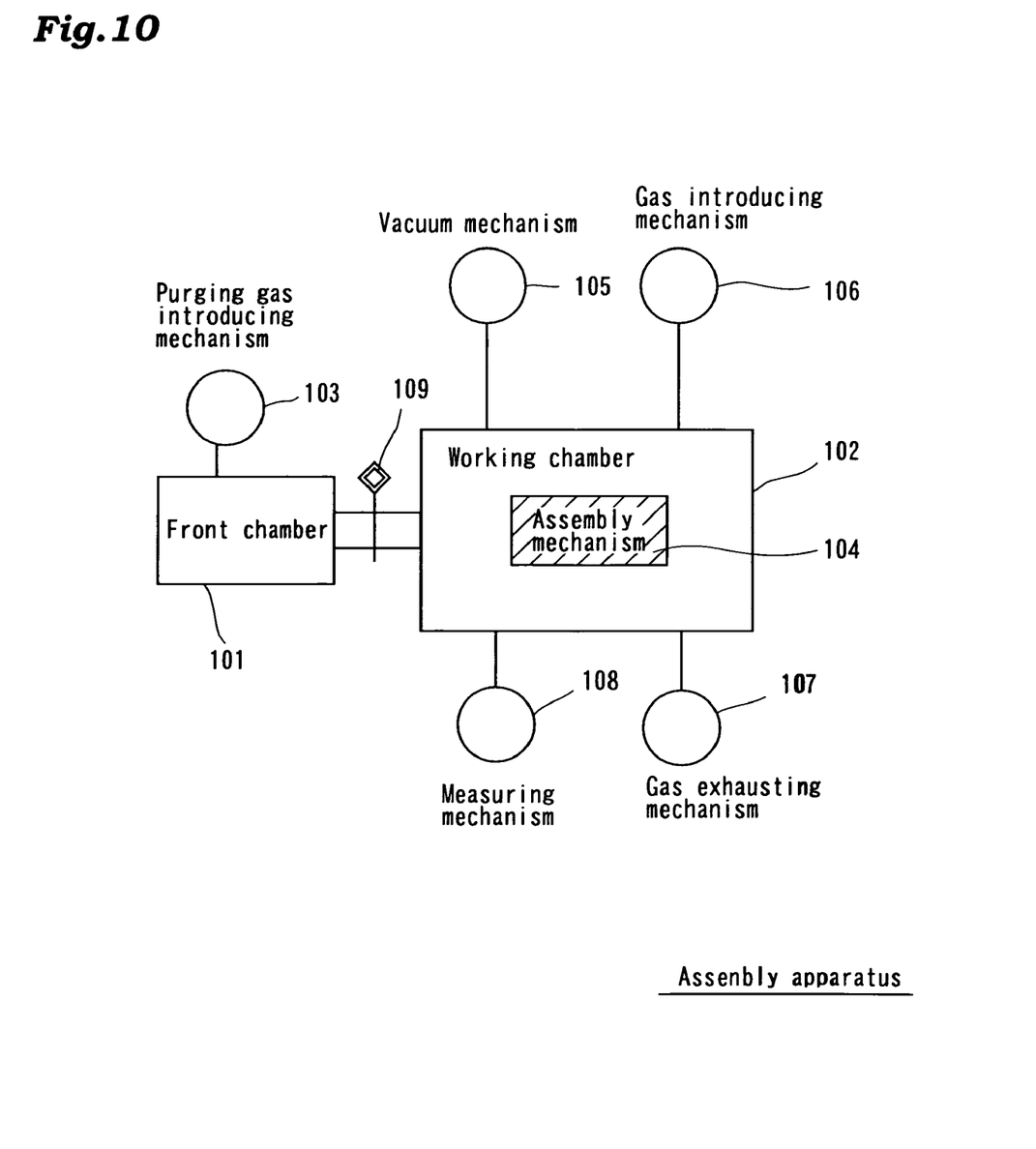
FIG. 10 is a schematic view of an assembly apparatus according to example 2.

Referring to FIG. 10, the assembly apparatus has a front chamber 101 and a working chamber 102. The front chamber 101 enables a necessary member for assembly to be introduced into the working chamber 102 without opening the working chamber 102 to atmosphere. To this end, the front chamber 101 has a mechanism 103 for introducing a purging gas. The working chamber 102 has therein an assembly mechanism 104 for assembling the nitride semiconductor laser device, thereby enabling assembly work in an externally-isolated sealed space. Between the front chamber 101 and the working chamber 102, there is transfer means (not shown) for transferring the necessary member for assembly. The front chamber 101 and the working chamber 102 are intercepted by a door 109.

The working chamber 102 also has: a vacuum mechanism 105 for making the in of the working chamber 102 vacuum in order to enable the in to reach a desired pressure, a desired kind of atmosphere gas, a desired oxygen concentration, and a desired dew point; a gas introducing mechanism 106 for filling the in of the working chamber 102 with a desired atmosphere gas; a gas exhausting mechanism 107 for exhausting gas from in the device to the outside; and a measuring mechanism 108 for detecting the oxygen concentration and dew point in the working chamber 102.

Next, operation will be described. First, a member necessary for assembly is transferred from the outside to the front chamber 101. The door 109 is closed and the in of the front chamber 101 is substituted with a purging gas. The door 109 is then opened and the member necessary for assembly is moved from the front chamber 101 to the working chamber 102 by transfer means not shown. This enables the member necessary for assembly to be introduced into the working chamber 102 without opening the working chamber 102 to atmosphere. Next, the door 109 is closed to hermetically seal the working chamber 102. The pressure in the working chamber 102, the kind of the atmosphere gas, and the oxygen concentration or dew temperature are set to be identical respectively to the enclosed pressure, the kind of the enclosed atmosphere gas, and the oxygen concentration or dew temperature of the above-described nitride semiconductor laser device. In the working chamber 102 and under the above-described atmosphere, the semiconductor light-emitting device is assembled using the assembly mechanism 104. Thus, by simply assembling the nitride semiconductor laser in the working chamber 102, the cap is filled with the above-described atmosphere.

The present invention finds applications in nitride semiconductor lasers, particularly devices of high output such as those providing a light output of 100 mW or more in the single transverse mode type. These devices usually require driving at a high current density of more than 13 kA/cm$^2$. The present invention also finds applications in semiconductor laser devices using nitride semiconductor such as a single semiconductor layer device, hologram laser devices having hologram elements, opto-electronics IC devices packaged integrally with IC chips for driving or processing such as signal detection, and complex optical devices packaged integrally with waveguides or fine optical elements.

While oxygen has been exemplified as a component to inhibit diffusion of hydrogen atoms, the present invention is not limited to oxygen. Referring again to FIGS. 1 and 5, any gas may be used insofar as diffusion of hydrogen atoms is stopped by balancing out the direction of movement of hydrogen atoms in the semiconductor layers and the direction of diffusion of hydrogen atoms represented by the arrows 1 in FIG. 5.

The present invention finds applications in semiconductor laser devices, hologram laser devices, opto-electronics IC devices, complex optical devices, and the like, abnormality due to an increase in element operation voltage during current electrification.

The Embodiments herein described are to be considered in all respects as illustrative and not restrictive. The scope of the invention should be determined not by the above-illustrated, but by the appended claims, and all changes which come within the meaning and range of equivalency of the appended claims are therefore intended to be embraced therein.

What is claimed is:

1. A semiconductor light-emitting device comprising:
   a stem;
   a heat sink provided on the stem;
   at least one semiconductor light-emitting element connected to the heat sink, the semiconductor light-emitting element including an insulation layer containing hydrogen atoms at a concentration of $1 \times 10^{17}/cm^3$ or more;
   a light-detecting element provided on the stem, for detecting light from the semiconductor light-emitting element; and
   a cap connected to the stem, for encapsulating therein the heat sink, the semiconductor light-emitting element, and the light-detecting element in a sealed manner,
   wherein an atmosphere in the cap contains a component for inhibiting diffusion of hydrogen atoms contained in the semiconductor light-emitting element.

2. The semiconductor light-emitting device according to claim 1, wherein the semiconductor light-emitting element comprises:
   a ridge-stripe structure on a front surface thereof, the ridge-stripe structure forming a current-confined-path structure having one electrode electrically connected only to a top of a protruding portion of the ridge-stripe structure; and
   the insulation layer sandwiching the protruding portion of the ridge-stripe structure.

3. The semiconductor light-emitting device according to claim 1, wherein the component for inhibiting diffusion of hydrogen atoms includes oxygen.

4. The semiconductor light-emitting device according to claim 1, wherein the insulation layer comprises a dielectric containing at least one of $SiO_2$, $TiO_2$, $ZrO_2$, $HfO_2$, $CeO_2$, $InO_3$, $Nd_2O_5$, $Sb_2O_3$, $SnO_2$, $Ta_2O_5$, and $ZnO$.

5. The semiconductor light-emitting device according to claim 3, wherein the atmosphere contains oxygen at a concentration of at least 10 ppm.

6. The semiconductor light-emitting device according to claim 1, wherein the concentration of moisture contained in the atmosphere is less than 1000 ppm.

7. The semiconductor light-emitting device according to claim 1, wherein the atmosphere has a pressure of from 0.1 Pa to 200 kPa.

8. The semiconductor light-emitting device according to claim 1, wherein the semiconductor light-emitting element comprises group III nitride semiconductor laser element.

9. The semiconductor light-emitting device according to claim 1, wherein the semiconductor light-emitting element comprises group III-V compound semiconductor light-emitting element.

10. The semiconductor light-emitting device according to claim 1, wherein the semiconductor light-emitting element contains hydrogen atoms in its semiconductor layer structure.

11. The semiconductor light-emitting device according to claim 1, wherein the atmosphere contains carbon dioxide.

12. The semiconductor light-emitting device according to claim 1, wherein the atmosphere contains argon.

13. A method for fabricating a semiconductor light-emitting device according to claim 1, the method comprising the steps of:
   preparing a fabricating apparatus comprising a working chamber having a mechanism and an externally-isolated sealed space for assembling the semiconductor light-emitting device and a front chamber linked to the working chamber for temporarily holding a member necessary for assembly of the semiconductor light-emitting device;
   introducing the necessary member to the front chamber;
   moving the necessary member from the front chamber to the working chamber without opening the working chamber to atmosphere;
   substituting an atmosphere in the working chamber with a diffusion-inhibiting atmosphere containing a component for inhibiting diffusion of hydrogen atoms contained in the semiconductor light-emitting element; and
   assembling the semiconductor light-emitting device in the working chamber under the diffusion-inhibiting atmosphere,
   wherein the diffusion-inhibiting atmosphere can be filled in the cap by merely assembling the semiconductor light-emitting device in the working chamber.

14. A semiconductor light-emitting device comprising:
   (1) a stem;
   (2) a heat sink provided on the stem;
   at least one semiconductor light-emitting element connected to the heat sink,
   the semiconductor light-emitting element comprising:
   a ridge-stripe structure on a front surface thereof, the ridge-stripe structure forming a current-confined-path structure having one electrode electrically connected only to a top of a protruding portion of the ridge-stripe structure; and
   a semiconductor layer sandwiching the protruding portion of the ridge-stripe structure, the semiconductor layer having substantially the same composition as a composition of the protruding portion of the ridge-stripe structure while having an opposite polarity to a polarity of the protruding portion and containing hydrogen atoms at a concentration of $1 \times 10^{17}/cm^3$ or more;

(3) a light-detecting element provided on the stem, for detecting light from the semiconductor light-emitting element; and (4) a cap connected to the stem, for encapsulating therein the heat sink, the semiconductor light-emitting element, and the light-detecting element in a sealed manner, wherein an atmosphere in the cap contains a component for inhibiting diffusion of hydrogen atoms contained in the semiconductor light-emitting element.

* * * * *

UNITED STATES PATENT AND TRADEMARK OFFICE
CERTIFICATE OF CORRECTION

PATENT NO. : 7,656,916 B2 Page 1 of 1
APPLICATION NO. : 12/000929
DATED : February 2, 2010
INVENTOR(S) : Kunihiro Takatani et al.

It is certified that error appears in the above-identified patent and that said Letters Patent is hereby corrected as shown below:

Col. 12, line 6, claim 4, should read:

4. The semiconductor light-emitting device according to claim 2, wherein the insulation layer comprises a dielectric containing at least one of $SiO_2$, $TiO_2$, $ZrO_2$, $HfO_2$, $CeO_2$, $In_2O_3$, $Nd_2O_5$, $Sb_2O_3$, $SnO_2$, $Ta_2O_5$, and ZnO.

Signed and Sealed this

Sixth Day of July, 2010

David J. Kappos
*Director of the United States Patent and Trademark Office*